(12) United States Patent
Asai et al.

(10) Patent No.: US 10,860,005 B2
(45) Date of Patent: Dec. 8, 2020

(54) SUBSTRATE PROCESSING APPARATUS AND NON-TRANSITORY COMPUTER-READABLE RECORDING MEDIUM

(71) Applicant: HITACHI KOKUSAI ELECTRIC INC., Tokyo (JP)

(72) Inventors: Kazuhide Asai, Toyama (JP); Hiroyuki Iwakura, Toyama (JP); Hidemoto Hayashihara, Toyama (JP); Mitsuru Fukuda, Toyama (JP); Kazuyoshi Yamamoto, Toyama (JP); Kayoko Yashiki, Toyama (JP); Takayuki Kawagishi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 449 days.

(21) Appl. No.: 15/708,597

(22) Filed: Sep. 19, 2017

(65) Prior Publication Data

US 2018/0120822 A1 May 3, 2018

(30) Foreign Application Priority Data

Oct. 31, 2016 (JP) ................................ 2016-212945
Jun. 26, 2017 (JP) ................................ 2017-124391

(51) Int. Cl.
*H05B 1/02* (2006.01)
*G05B 19/418* (2006.01)
(Continued)

(52) U.S. Cl.
CPC ........ *G05B 19/4184* (2013.01); *C23C 16/345* (2013.01); *C23C 16/45523* (2013.01);
(Continued)

(58) Field of Classification Search
CPC .............. C05B 19/4184; C05B 23/027; C05B 2219/45031; C23C 16/345; C23C 16/46;
(Continued)

(56) References Cited

U.S. PATENT DOCUMENTS 9,581,996 B2     2/2017  Asai et al.
2006/0058898 A1*  3/2006  Emigholz ............ C10G 11/187
                                                        700/29
(Continued)

FOREIGN PATENT DOCUMENTS

JP    2012-186213 A    9/2012
JP    2015-185824 A    10/2015
(Continued)

OTHER PUBLICATIONS

Korean Office Action dated Nov. 27, 2018 for the Korean Patent Application No. 10-2017-0109776.

*Primary Examiner* — Mark H Paschall
(74) *Attorney, Agent, or Firm* — Volpe Koenig

(57) ABSTRACT

There is provided a technique for detecting a fault of a device from an error in device data. According to the technique described herein, there is provided a substrate processing apparatus including: a pipe heater configured to heat a gas pipe; a temperature detecting unit provided at the pipe heater and configured to detect a temperature of the gas pipe; a control unit configured to control the pipe heater based on device data representing the temperature of the gas pipe measured by the temperature detecting unit by executing a process control program to adjust an electrical power applied to the pipe heater; a memory unit configured to store a monitored item table; and a device status monitoring unit configured to execute a device status monitoring program.

11 Claims, 13 Drawing Sheets

(51) Int. Cl.
    *C23C 16/34*     (2006.01)
    *C23C 16/52*     (2006.01)
    *H01L 21/67*     (2006.01)
    *C23C 16/46*     (2006.01)
    *C23C 16/455*     (2006.01)
    *G05B 23/02*     (2006.01)

(52) U.S. Cl.
    CPC .............. *C23C 16/46* (2013.01); *C23C 16/52* (2013.01); *H01L 21/67017* (2013.01); *H01L 21/67248* (2013.01); *H01L 21/67253* (2013.01); *H01L 21/67288* (2013.01); *G05B 23/027* (2013.01); *G05B 2219/45031* (2013.01)

(58) Field of Classification Search
    CPC ............... C23C 16/52; H01L 21/67017; H01L 21/67248; H01L 21/77258; H05B 1/01; H05B 1/0247; H05B 3/009; H05B 3/56

USPC ................................. 219/494, 497, 506, 535
See application file for complete search history.

(56) References Cited

U.S. PATENT DOCUMENTS

2008/0288217 A1* 11/2008 Akao ..................... G01D 9/005
                                                                  702/187
2011/0071465 A1* 3/2011 Wang ..................... A61M 1/14
                                                                  604/67

FOREIGN PATENT DOCUMENTS

JP            5855841 B2     2/2016
KR    10-2005-0033904 A     4/2005

\* cited by examiner

FIG. 6

| FAULTS | DEVICE DATA | STATISTICAL DATA | MONITORED STEP | RULE |
|---|---|---|---|---|
| ·Temperature error at exhaust pipe | ·Electrical power<br>·Measured temperature | ·Average | ·Film-forming step | ·Diagnostic rule 38 |

FIG. 9

| AREA | MODULE | U.FDC | S.FDC | PARTS |
|---|---|---|---|---|
| PROCESS CHAMBER | TEMPERATURE | ... | ... | ... |
| | PRESSURE | ... | ... | ... |
| | GAS | ... | ... | ... |
| | EXHAUST | ... | A | ... |
| | WATER | ... | ... | ... |
| TRANSFER CHAMBER | OXYGEN CONCENTRATION | ... | ... | ... |

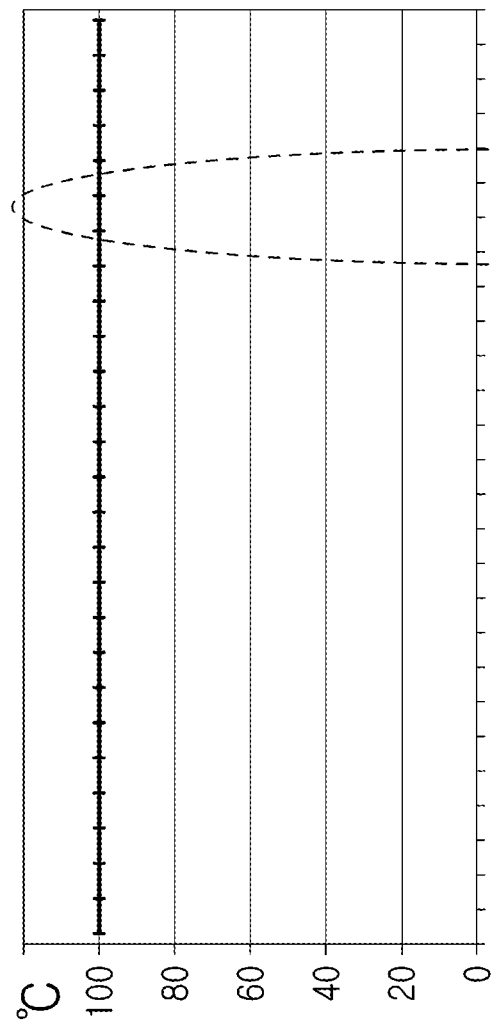
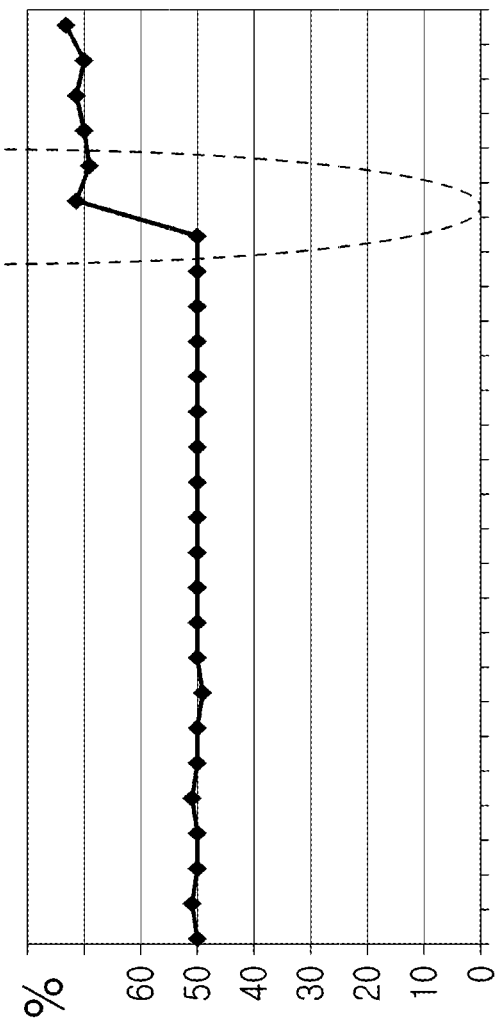
FIG. 10A
FIG. 10B

SUBSTRATE PROCESSING APPARATUS AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. § 119 of Japanese Patent Application No. 2016-212945, filed on Oct. 31, 2016 and Japanese Patent Application No. 2017-124391, filed on Jun. 26, 2017, in the Japanese Patent Office, the entire contents of which are hereby incorporated by reference.

BACKGROUND

1. Field

The present disclosure relates to a substrate processing apparatus and a non-transitory computer-readable recording medium.

2. Description of the Related Art

In the semiconductor manufacturing field, information on an apparatus such as a substrate processing apparatus is accumulated in order to improve the operating rate or the production efficiency of the apparatus. The accumulated information may be used to analyze a fault of the apparatus or to monitor states of the apparatus. The occurrence of the fault of the apparatus is checked based on measured values reported from the monitored object using a method such as SPC (Statistical Process Control). The integrity of the data used for production control of the substrate processing apparatus can be managed using the SPC, for example.

A technique for monitoring the state of the source gas, which flows in a pipe, may be used by detecting the change in the temperature of the pipe. However, when only one data (e.g. the measured temperature) is monitored, it is not possible to accurately check whether the change in the measured temperature is the actual change in the temperature.

Moreover, since the amount of data increases with the miniaturization of devices, more accurate and detailed data management is required.

SUMMARY

Described herein is a technique capable of detecting a fault of an apparatus by monitoring an error in a device data.

According to one aspect of the technique described herein, there is provided a substrate processing apparatus including: a pipe heater configured to heat a gas pipe; a temperature detecting unit provided at the pipe heater and configured to detect a temperature of the gas pipe; a control unit having a processor and a memory and operable to execute a process control program for monitoring and controlling parameters of a substrate processing, wherein the control unit is configured to control the pipe heater based on device data representing the temperature of the gas pipe measured by the temperature detecting unit by executing the process control program to adjust an electrical power applied to the pipe heater; a memory unit configured to store a monitored item table defining: a FAULT item indicative of a fault; a DEVICE DATA item indicative of a type of device data for detecting the fault; a STATISTICAL DATA item indicative of statistical data obtained from the device data indicated by the DEVICE DATA item; a MONITORED STEP item indicative of a period being monitored to obtain the statistical data indicated by the STATISTICAL DATA item; and a RULE item indicative of diagnostic rule for diagnosing the fault indicated in the FAULT item; and a device status monitoring unit configured to execute a device status monitoring program, the device status monitoring program configured to perform: (a) collecting the device data representing the temperature and device data representing the electrical power transmitted from the control unit; (b) calculating current statistical data from the device data representing the temperature and the device data representing the electrical power; (c) comparing the current statistical data from the device data representing the temperature obtained from a step indicated in the MONITORED STEP item with a previous statistical data of device data representing temperature obtained from the step indicated in the MONITORED STEP item stored previously in the memory unit; and (d) comparing the current statistical data from the device data representing the electrical power obtained from the step indicated in the MONITORED STEP item with a previous statistical data of device data representing electrical power obtained from the step obtained from the step indicated in the MONITORED STEP item stored previously in the memory unit to determine whether a difference between the current statistical data from the device data representing the electrical power and the previous statistical data of device data representing electrical power is equal to or smaller than a second reference value when a difference between the current statistical data from the device data representing the temperature and the previous statistical data of device data representing temperature is equal to or smaller than a first reference value.

BRIEF DESCRIPTION OF THE DRAWINGS

FIG. 6 illustrates a monitored item table preferably used in the embodiment.

FIG. 9 illustrates a result of the monitoring program executed by the device status monitoring unit of the substrate processing apparatus according to the embodiment.

FIGS. 10A and 10B are graphs illustrating an average of temperature of a pipe and an average of electrical power applied to a pipe heater, respectively, obtained by data analysis program executed by a fault analysis unit.

Figure 1:
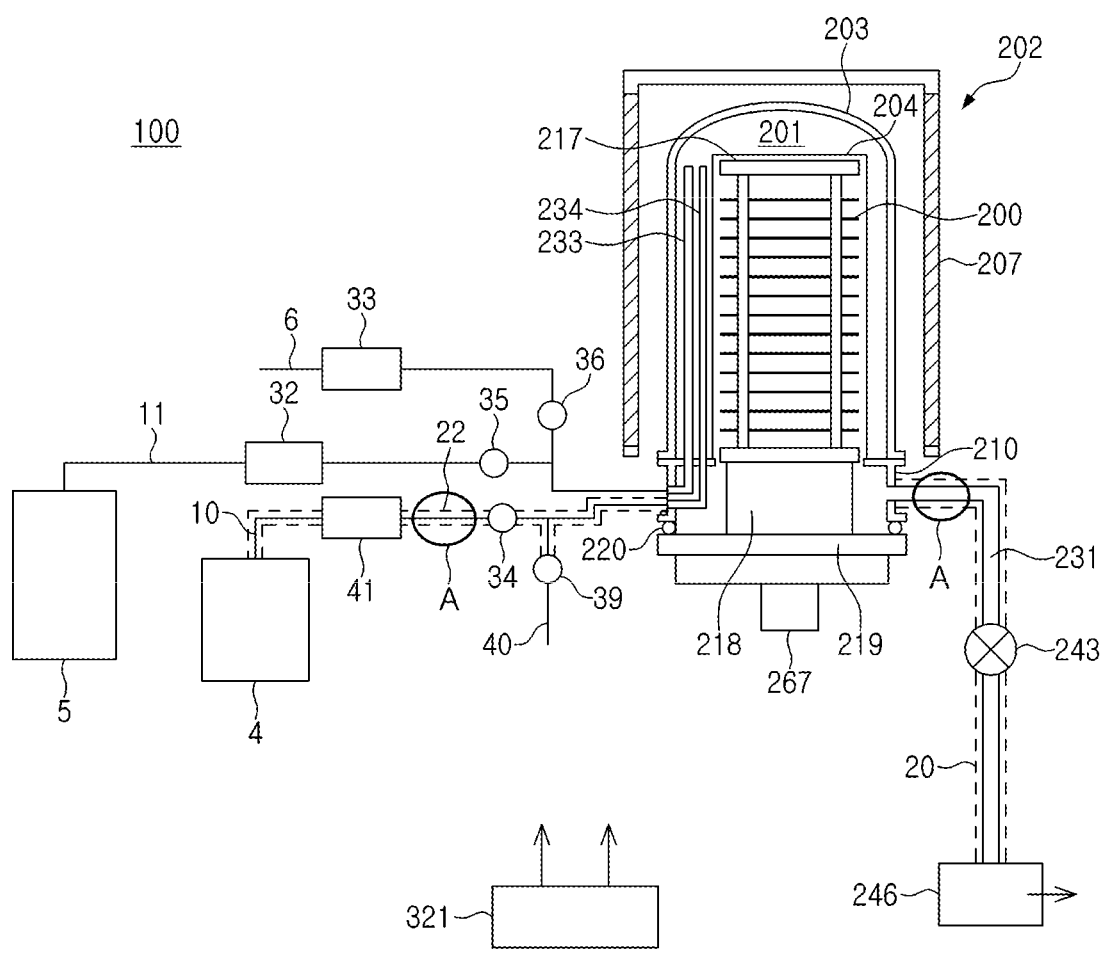
FIG. 1 is a perspective view schematically illustrating a substrate processing apparatus preferably used in an embodiment described herein.

DETAILED DESCRIPTION (1) Configuration of Substrate Processing Apparatus

Hereinafter, an embodiment will be described. A substrate processing apparatus according to the embodiment will be described with reference to the drawings. In the following description, components having the same function among the components shown in the respective drawings are denoted by the same reference numerals, and redundant description is omitted. Also, for convenience of description, features such as width, thickness and shape of each component shown in each figure can be schematically shown differently from the actual configuration. However, the features of each of these components are merely exemplary, and the above-described techniques are not limited to the above features.

<Process Furnace>

As illustrated in FIG. 1, a substrate processing apparatus 100 according to the embodiment includes a process furnace 202. A reaction tube 203, which is a process vessel where wafers (substrates) 200 are processed is provided inside a heater (first heating unit) 207. An inlet flange 210 serving as a furnace opening is provided under the reaction tube 203. The lower end opening of the inlet flange 210 is air-tightly sealed by a seal cap (furnace opening cover) 219 via O-ring (sealing member) 220. An inner tube 204 is provided in the reaction tube 203. A process chamber 201 is defined by at least the reaction tube 203, the inner tube 204 and the seal cap 219. The inner tube 204 is placed on the inlet flange 210. A boat (substrate retainer) 217 is provided on the seal cap 219 via a quartz cap 218. The quartz cap 218 and the boat 217 are loaded into or unloaded from the process chamber 201. The wafers subjected to a batch process are supported by the boat 217 in multiple stages in horizontal orientation. The heater 207 heats the wafers 200 accommodated in the process chamber 201 to a predetermined temperature.

A gas pipe 10 configured to supply a first source gas (first process gas) and a gas pipe 11 configured to supply a second process gas (reactive gas) are spatially in communication with the process chamber 201. A gas supply source 4 configured to supply the first source gas, an MFC (Mass Flow Controller) 41, which is a flow rate controller, configured to control a flow rate of the first source gas supplied from the gas supply source 4, and a valve 34 configured to open/close a flow path of the first source gas are sequentially provided at the gas pipe 10 from the upstream side to the downstream side of the gas pipe 10. The first process gas is supplied to the process chamber 201 through the gas pipe 10 provided with the gas supply source 4, the MFC 41 and the valve 43 and a nozzle 234 installed in the process chamber 201. The gas pipe 10, the MFC 41, the valve 43 and the nozzle 234 constitutes a first process gas supply system.

A gas supply source 5 configured to supply a first reactive gas (second process gas), an MFC 32, which is a flow rate controller, configured to control a flow rate of the first reactive gas supplied from the gas supply source 5, and a valve 35 configured to open/close a flow path of the first reactive gas are sequentially provided at the gas pipe 11 from the upstream side to the downstream side of the gas pipe 1. The second process gas is supplied to the process chamber 201 through the gas pipe 11 provided with the gas supply source 5, the MFC 32 and the valve 35 and a nozzle 233 provided in the process chamber 201. The gas pipe 11, the MFC 32, the valve 35 and the nozzle 233 constitutes a second process gas supply system.

A gas pipe heater 22 for heating the gas pipe 10 is provided around the gas pipe 10 connecting the gas supply source 4 to the process chamber 201. The gas pipe heater 22 (hereinafter also referred to as "first exhaust pipe heater") may include a jacket heater. A gas pipe 40 configured to supply an inert gas is connected to the gas pipe 10 at the downstream side of the valve 34 via a valve 39. According to the embodiment, the gas pipe heater 22 is provided only in the first process gas supply system but not in the second process gas supply system. However, depending on the second process gas, the gas pipe heater 22 may be appropriately provided in the second process gas supply system as well.

The process chamber 201 is connected to a vacuum pump 246 through an exhaust pipe 231 configured to exhaust a gas and an APC (Automatic Pressure Controller) valve 243. The exhaust pipe 231, the APC valve 243 and the vacuum pump 246 constitutes a gas exhaust system. A exhaust pipe heater (third heating unit) 20 (also referred to as a second pipe heater) for heating the exhaust pipe 231 is provided around the exhaust pipe 231 connecting the reaction tube 203 to a vacuum pump 246. The exhaust pipe heater 20 may include a jacket heater. Hereinafter, the exhaust pipe heater 20 and the gas pipe heater 22 are collectively referred to as a pipe heater 310. Similarly, the gas pipes 10, 11, 40 and 231 are collectively referred to simply as "gas pipes".

The nozzle 234 is installed in the reaction tube 203 so as to extend from bottom to top of the inner wall of the reaction tube 203. Gas supply holes (not shown) configured to supply the source gas are disposed at the nozzle 234. The gas supply holes face the wafers 200 via the inner tube 204. The process gas is supplied to the wafer 200 through the gas supply holes. The nozzle 233 is provided in the same manner as the nozzle 234 at a position farther from the center of the reaction tube 203 than the nozzle 234. Gas supply holes (not shown) configured to supply the reactive gas are provided at the nozzle 233. The nozzle 234 is spatially in communication with the gas pipe 10. The first process gas and the inert gas supplied through the gas pipe 40 connected to the gas pipe 10 are supplied into the process chamber 201 through the nozzle 234. The nozzle 233 is in communication with the gas pipe 11. The second process gas and the inert gas supplied through the gas pipe 6 connected to the gas pipe 11 are supplied into the process chamber 201 through the nozzle 233. The film-forming step is performed by alternately supplying the first process gas and the second process gas into the process chamber 201 through the nozzle 234 and the nozzle 233, respectively.

The boat 217 for supporting the wafers 200 in multiple stages at equal intervals is provided in the inner tube 204. The boat 217 may be loaded into the process chamber 201 or unloaded from the process chamber 201 by a boat elevator (not shown). In order to improve a uniformity of substrate processing, a boat rotating mechanism 267, which rotates the boat 217, is provided. By rotating the boat rotating mechanism 267, the boat 217 supported by the quartz cap 218 is rotated.

<Configuration of Control System 300>

Figure 2:
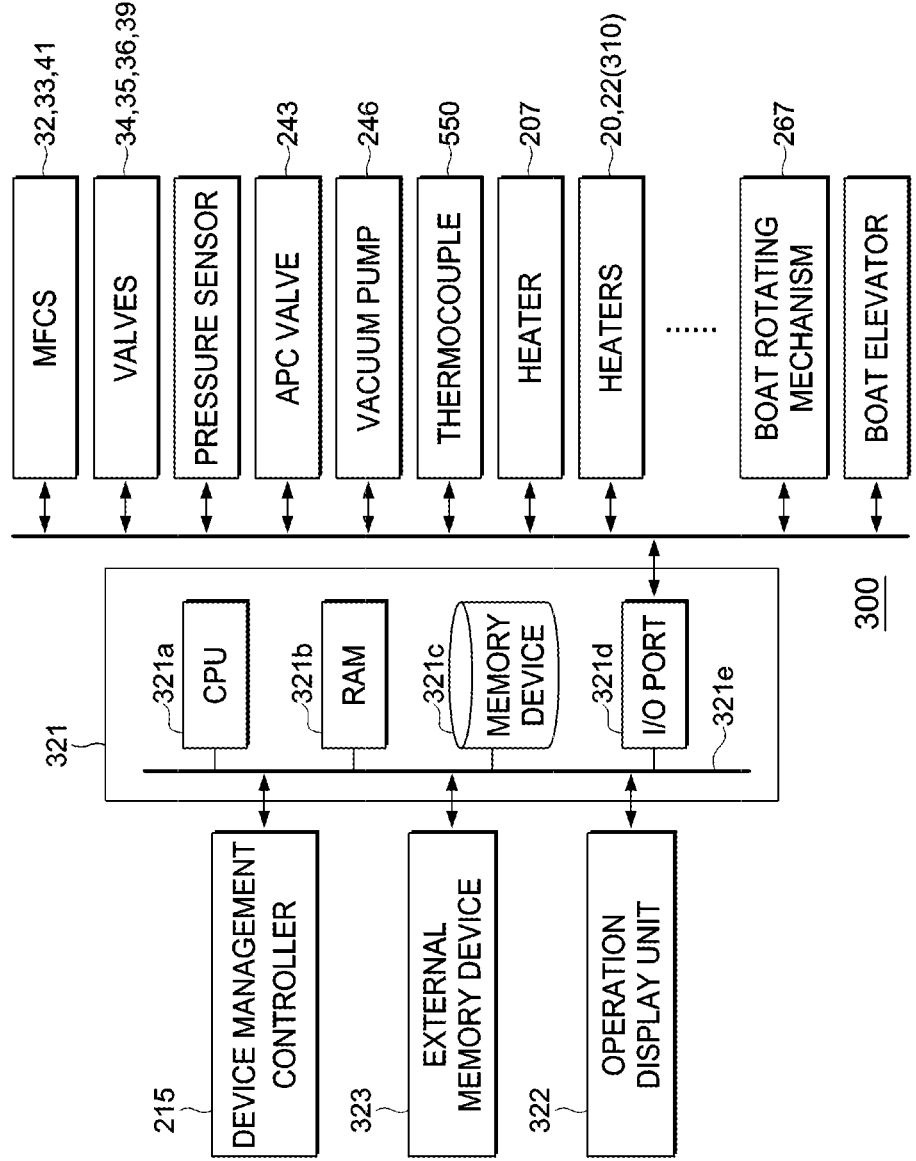
FIG. 2 schematically illustrates a control system and peripherals thereof of the substrate processing apparatus according to the embodiment.

As shown in FIG. 2, a control system 300 may include a controller 321 serving as a main controller and a device management controller 215 configured to collect and monitor device data transmitted from the controller 321.

The device data is generated by the operation of each component of the substrate processing apparatus when the substrate processing apparatus processes the substrate 200.

For example, the device data may include: data related to substrate processing such as the process temperature, process pressure and flow rate of the process gas when the substrate processing apparatus processes the substrate 200; data about the quality of a product substrate such as the thickness of the film and the accumulated thickness of the film; and data related to the components of the substrate processing apparatus 100 such as reaction tube, heater, valve and MFC.

Actual measurement value data collected at predetermined time intervals during the execution of the recipe, for example, the data collected from the start to the finish of the recipe and statistical data obtained at each step in the recipe, may be referred to as process data. The device data may include the process data. In general, the statistical data includes values such as maximum value, minimum value and average value. The device data may also include event data collected when the substrate processing apparatus is in the idle state or during maintenance such as replacing components of the substrate processing apparatus. AN example of event data includes data representing maintenance history.

<Configuration of Main Controller 321>

Next, the controller 321 serving as the main controller will be described with reference to FIG. 2.

The controller 321 is connected to the components such as the heater 207, the gas pipe heater 22, the exhaust pipe heater 20, the flow rate controllers (MFCs) 32, 33 and 41, the valves 34, 35, 36 and 39, the APC valve 243, the vacuum pump 246, the boat rotating mechanism 267 and a boat elevating mechanism (boat elevator). The controller 321 may be configured to control various operations such as temperature adjusting operations of the heater 207 and the pipe heater 310, flow rate adjusting operations of the flow rate controllers (MFCs) 32, 33 and 41, opening/closing operations of the valves 34, 35, 36 and 39, an opening/closing operation of the APC valve 243, the operation of the vacuum pump 246, a rotation speed adjusting operation of the boat 217 by the boat rotating mechanism 267, and an elevating operation of the boat 217 by the boat elevator The controller 321 serving as the main controller is embodied by a computer including a CPU (Central Processing Unit) 321a, a RAM (Random Access Memory) 321b, a memory device 321c and an I/O port 321d. The RAM 321b, the memory device 321c and the I/O port 321d may exchange data with the CPU 321a through an internal bus 321e. For example, an operation display unit 322 serving as an input/output device such as a touch panel is connected to the controller 321.

The memory device 321c is embodied by components such as a flash memory. A control program for controlling the operation of the substrate processing apparatus or a process recipe containing information on the sequence and conditions of a substrate processing described later is readably stored in the memory device 321c. The process recipe is obtained by combining steps of the substrate processing described later such that the controller 321 can execute the steps to acquire a predetermine result. The process recipe is a program that causes the controller 321 to execute each procedure in the substrate processing process including the substrate loading process S102 to the substrate unloading process S106. That is, the process recipe is executed in a manner that parameters of a substrate processing may be monitored and controlled. Hereafter, the process recipe and the control program are collectively referred to as a program. The process recipe is simply referred to as a recipe or a process control program. Herein "program" may refer to either one of the process recipe or the control program, or both. The RAM 321b is a work area where a program or data read by the CPU 321a is temporarily stored.

The I/O port 321d is connected to the above-described components such as the MFCs 32, 33 and 41, the valves 34, 35, 36 and 39, a pressure sensor, the APC valve 243, the vacuum pump 246, the heater 207, the pipe heater 310, a temperature detection unit (thermocouple) 550, the boat rotating mechanism 267 and the boat elevator.

The CPU 321a is configured to read a control program from the memory device 321c and execute the read control program. Furthermore, the CPU 321a is configured to read a process recipe from the memory device 321c according to an operation command inputted from the operation display unit 322 serving as the input/output device. According to the contents of the read process recipe, the CPU 321a may be configured to control various operations such as flow rate adjusting operations for various gases by the flow rate controllers (MFCs) 32, 33 and 41, opening/closing operations of the valves 34, 35, 36 and 39, an opening/closing operation of the APC valve 243, an operation of the APC valve 243 based on the pressure measured by a pressure sensor (not shown), an operation of the heater 207 based on the temperature measured by temperature sensors (not shown) provided in each zone of the process chamber 201, an operation of the pipe heater 310 based on the temperature measured by the temperature detection unit 550, an operation of the vacuum pump 246, a rotating operation of the boat 217 by the boat rotating mechanism 267, and an elevating operation of the boat 217 by the boat elevator.

The controller 321 may be embodied by installing the above-described program stored in an external memory device 323 into a computer, the external memory device 323 including a semiconductor memory such as a USB memory or a memory card. The memory device 321c or the external memory device 323 may be embodied by a transitory computer readable recording medium. Hereafter, the memory device 321c and the external memory device 323 are collectively referred to as recording media. In this specification, "recording media" may indicate only the memory device 321c, indicate only the external memory device 323, and indicate both of the memory device 321c and the external memory device 323. In addition to the external memory device 323, a communication unit such as the Internet and dedicated line may be used as the unit for providing a program to a computer.

<Configuration of Device Management Controller 215>

Figure 3:
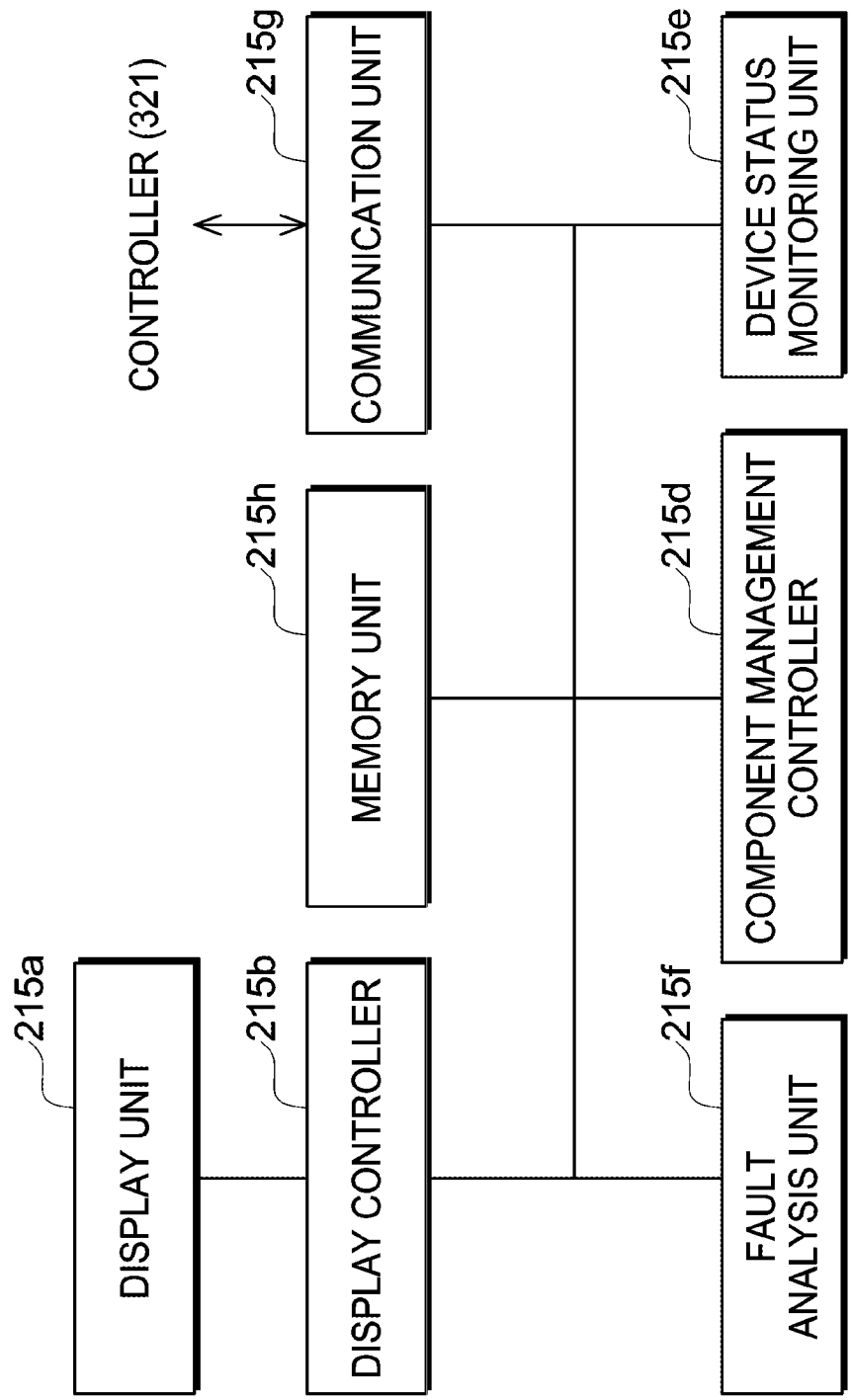
FIG. 3 schematically illustrates a device management controller of the substrate processing apparatus according to the embodiment.

Next, the device management controller 215 will be described with reference to FIG. 3. The device management controller 215 may include a display unit 215a, a display controller 215b, a device status monitoring unit 215e, a fault analysis unit 215f, a communication unit 215g configured to receive and transmit the device data of the corresponding substrate processing apparatus 100 from and to the controller 321, and a memory unit 215h configured to store various device data and programs transmitted from the substrate processing apparatus 100 (controller 321).

<Display Unit 215a>

The display unit 215a is configured to display the function of the device management controller 215. The operation display unit 322 of the controller 321 may be configured to display the function of the device management controller 215 instead of the device management controller 215. The controller 321 may be configured to display the function of the device management controller 215 on a display of an operation terminal instead of the display unit 215a.

<Display Controller 215b>

The display controller 215b is configured to execute the display program to create and update the display data obtained by processing the collected device data into data for display. The display controller 215b also controls the display unit 215a or the operation display unit 322 to display the display data thereon. The embodiment is described by way of an example wherein the display controller 215b displays the display data on the operation display unit 322 instead of the display unit 215a.

<Component Management Controller 215d>

The component management controller 215d is configured to monitor the life spans of the parts and to execute a component management program. The component management controller 215d stores and updates component management data, which is one of the device data of the substrate processing apparatus 100 received from the controller 321 and related to how many times or how long a part is used, in the memory unit 215h.

<Device Status Monitoring Unit 215e>

Figure 7:
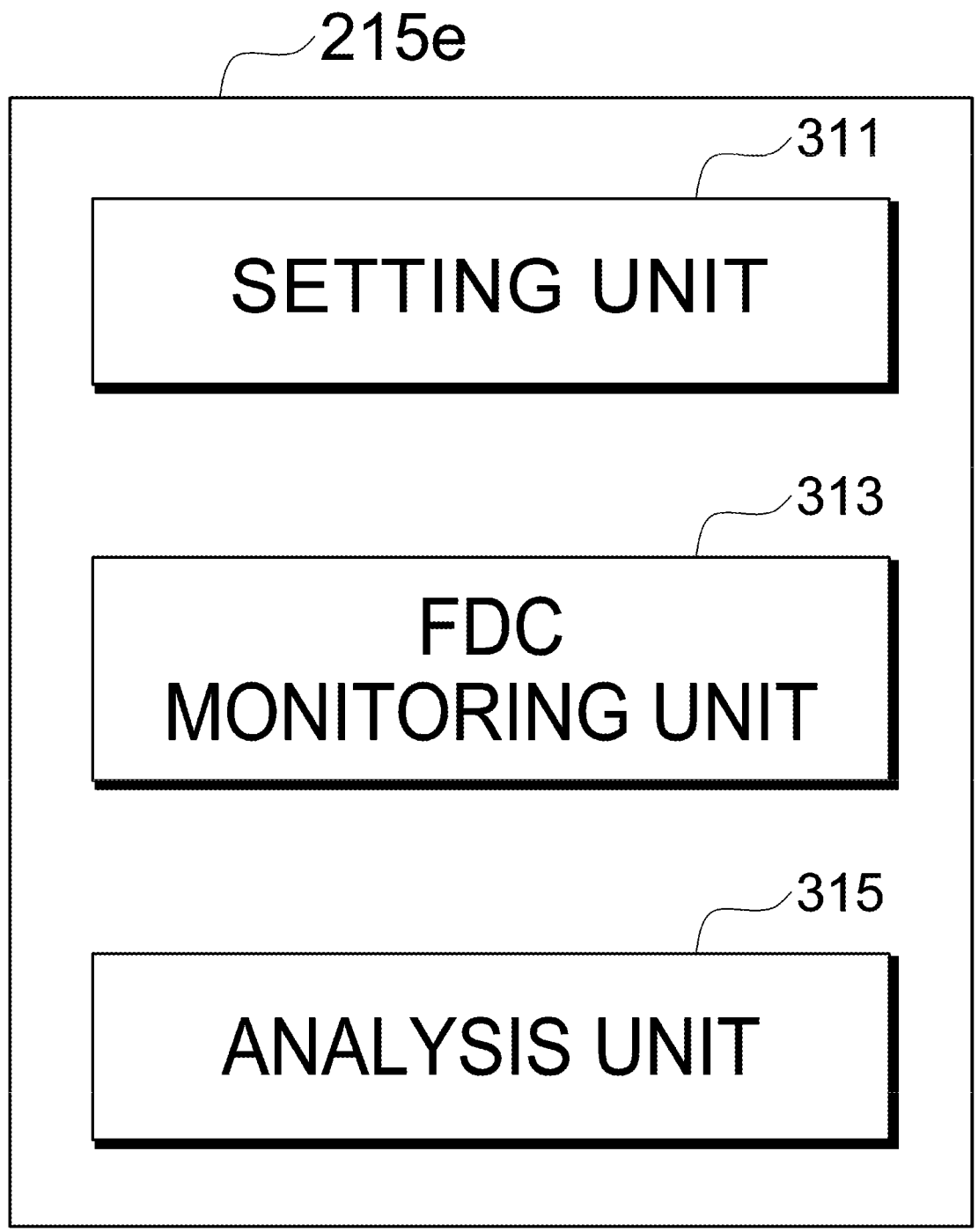
FIG. 7 schematically illustrates a device status monitoring unit of the substrate processing apparatus according to the embodiment.

The device status monitoring unit 215e is configured to store in a memory (e.g., memory unit 215h) a device status monitoring program for monitoring the status of the device and to execute the device status monitoring program to activate a device status monitoring function. As shown in FIG. 7, the device status monitoring unit 215e includes a setting unit 311, an FDC monitoring unit 313 and an analysis unit 315. FDC (Fault Detection and Classification) refers to a technique of classifying fault types when faults are detected by monitoring outputs of respective semiconductor manufacturing apparatuses and statistically processing the faults. A pipe temperature error monitoring program, which is an example of the device status monitoring program executed by the device status monitoring unit 215e, will be described later.

The setting unit 311 is configured to control the FDC monitoring unit 313 and the analysis unit 315 to determine an upper and a lower limits associated with the monitored device based on the device data of the monitored device designated by an input (operation command) from the operation display unit 322.

The FDC monitoring unit 313 is configured to generate reference values (for example, an upper limit and a lower limit of the temperature) for the monitored device under the instruction of the setting unit 311, and monitor the device data of the substrate processing apparatus 100 based on the reference value. That is, the FDC monitoring unit 313 compares, for example, the temperature or average thereof in the device data transmitted from the substrate processing apparatus 100 to the reference value to determine the occurrence of a fault in the substrate processing apparatus 100. The FDC monitoring unit 313 may be further configured to display the occurrence of a fault on the operation display unit 322.

The analysis unit 315 is configured to perform diagnostic of the device data or the statistical data using a diagnostic rule. When a fault is diagnosed, the analysis unit 315 is configured to indicate the occurrence of the fault on the operation display unit 322.

A band management (indicated as U.FDC in FIG. 9), which is one of the FDC performed by the device status monitoring unit 215e is described above. Minimal essential items (for example, the temperature of the process chamber) in the semiconductor manufacturing field are diagnosed by U.FDC.

The device status monitoring unit 215e is configured to collect the device data at predetermined intervals, for example, from the start to the end of the process recipe according to various items defined in the monitored item table by executing a monitoring program, and to calculate a statistical data (e.g., maximum value, minimum value and average value) of each step at the end thereof. The device status monitoring unit 215e is further configured to store the device data and the statistical data in the memory unit 215h as production history information for each batch process.

The device status monitoring unit 215e according to the embodiment is configured to accumulate in the memory unit 215h the event data including maintenance information while the process recipe is not executed and to display the statistical data on the operation display unit 322 in association with the maintenance operation. Therefore, a phenomenon that can not be displayed as a numerical value (for example, event data related to an event such as maintenance) may be displayed to facilitate the efficient checking of the fluctuation factors in the process data.

<Fault Analysis Unit 215f>

The fault analysis unit 215f is configured to display on the operation display unit 322 analysis data, which may be used by a maintenance personnel to analyze the cause of a fault when the fault (for example, a abnormality in thickness of a film on a substrate) occurs, by executing a data analysis program, thereby reducing the time necessary for the analysis and misanalysis due to the skill of maintenance personnel.

As described above, the device management controller 215 is connected to the controller 321 through, for example, a LAN (Local Area Network), collects the device data from the controller 321, processes the collected device data to generate graphs to be displayed on the operation display unit 322. The device management controller 215 is configured to monitor the status of the apparatus and the life spans of the parts. The device management controller 215 is further configured to display the operation status of the apparatus on the operation display unit 322 as shown in FIGS. 10A and 10B.

A hardware configuration of the device management controller 215 may be substantially the same as that of the controller 321. The device management controller 215 may be embodied by not only a dedicated computer system buts also a general purpose computer system. The device management controller 215 may be embodied by installing programs stored in the external memory device 323 into a computer, the external memory device 323 including a semiconductor memory such as a USB memory. In addition to the external memory device 323, a communication unit such as the Internet and dedicated line may be used as the unit for providing programs to the computer.

<Monitored Items>

The monitored items according to the embodiment will be described with reference to FIG. 9. FIG. 9 illustrates areas of the substrate processing apparatus 100 (denoted as "AREA" in FIG. 9), and items related to the process chamber and the transfer chambers (denoted as "MODULE" in FIG. 9) including "TEMPERATURE", "PRESSURE", "GAS", "EXHAUST", "WATER" and "OXYGEN CONCENTRATION".

U.FDC (User Fault Detection & Classification) is a diagnostic method using SPC described above. The U.FDC is created by specifying conditions such as recipe, step, and item (e.g., temperature) by a user of the substrate processing apparatus 100.

S.FDC (Special Fault Detection & Classification) is a monitored item for checking whether the components (for example, valves, heaters and MFCs) of the substrate processing apparatus 100 are normal. According to S.FDC, the device status monitoring program is used to check the monitored item table created by the manufacturer of the substrate processing apparatus 100.

According to the embodiment, the monitored item table includes a "FAULTS" item, a "DEVICE DATA" item required to detect a fault indicated by the "FAULTS" item, a "STATISTICAL DATA" item obtained from the device data indicated in the "DEVICE DATA" item, "MONITORED STEP" item indicating the step in which the device data indicated in "DEVICE DATA" item is collected, "RULE" item indicating a rule for diagnosing temperature, electrical power, averages thereof and faults indicated in the "MONITORED STEP" item, the "DEVICE DATA" item and the "STATISTICAL DATA" item.

According to the embodiment, S.FDC is used in diagnosing the temperature drop of the pipe. For example, the data representing the electrical power (%) applied to the pipe heater and the data representing the measured temperature of the pipe (° C.) are defined in the monitored item table. If the measured temperature of the pipe satisfies a predetermined condition, it is checked whether the electrical power applied to the pipe heater is within a predetermined range.

According to the embodiment, for example, when the difference between the current average value of the measured temperatures of the pipe and the previous average value of the measured temperatures of the pipe is equal to or less than 5° C., the current average of the electrical power applied to the pipe heater, the difference between the current average value of the electrical power applied to the pipe heater and the previous average value of the electrical power applied to the pipe heater is checked. When the difference between the averages of the temperatures is greater than 5° C., the difference between the averages of the electrical power is not checked.

"PARTS" in FIG. 9 is an item for diagnosing maintenance time of parts by comparing the data related to life span of parts constituting the substrate processing apparatus 100 such as hours of use and frequency of use to the recommended value of the manufacturer of the parts.

When the result of the diagnosis indicates a presence of a fault, the device status monitoring result data is displayed in the operation display unit 322 as, for example, an icon "A". For example, the icon "A" displayed on the operation display unit 322 as shown in FIG. 9 indicates that the item "EXHAUST" of the "PROCESS CHAMBER" is faulty as a result of using S.FDC.

(3) Substrate Processing

Next, a substrate processing using the substrate processing apparatus 100 serving as a semiconductor manufacturing apparatus will be described. The substrate processing is one of the semiconductor manufacturing processes. Also, in the description below, the controller 321 controls the operations of the components included in the substrate processing apparatus 100.

In the embodiment, the substrate processing will be exemplified by an example wherein a film is formed on the wafers 200 by alternately supplying the first process gas (source gas) and the second process gas (reactive gas). For example, a silicon nitride (SiN) film is formed on the wafers 200 using hexachlorodisilane ($Si_2Cl_6$, abbreviated as HCDS) gas as the source gas and $NH_3$ (ammonia) as the reactive gas. A predetermined film may be formed on the wafers 200 in advance and a predetermined pattern may be formed on the wafers 200 or the predetermined film in advance.

Figure 4:
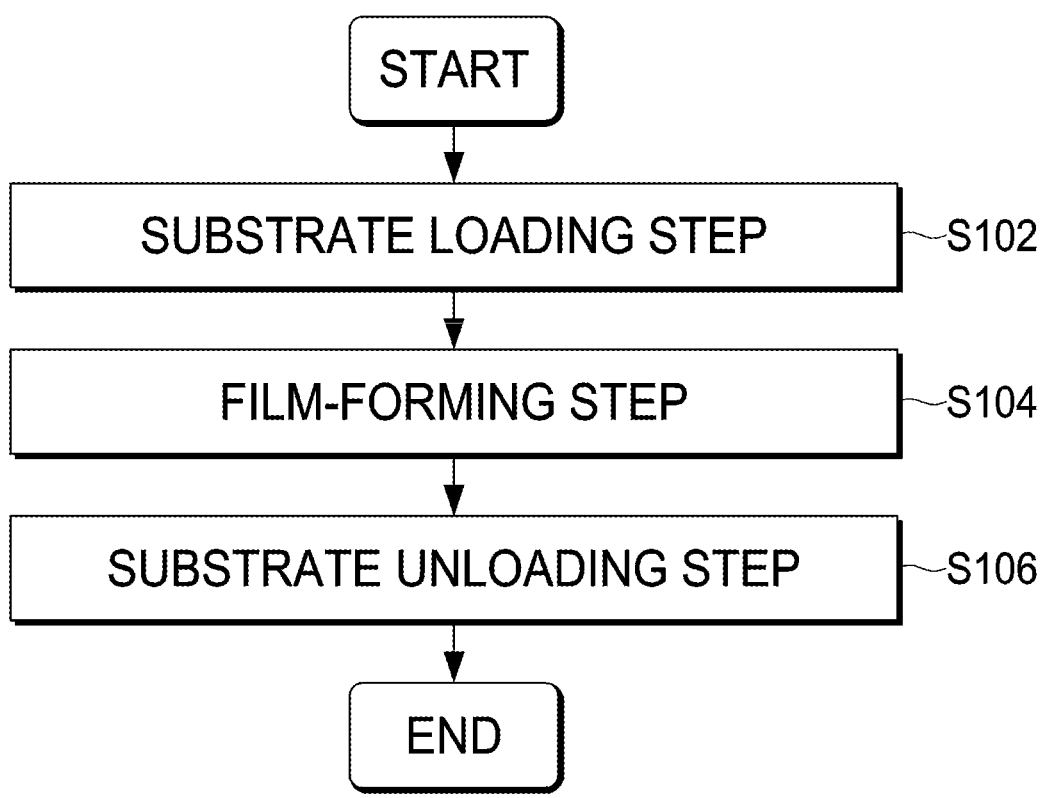
FIG. 4 is an exemplary flowchart illustrating a substrate processing preferably used in the embodiment.

The substrate processing will be described with reference to FIG. 4.

<Substrate Loading Step S102>

In the substrate loading step S102, the boat 217 is charged with the wafers 200. Then, the boat 217 is loaded into the process chamber 201.

<Film-Forming Step S104>

Next, the film-forming step S104 for forming the film on the surfaces of the wafers 200 is performed. In the film-forming step S104, four steps described below, namely, first through fourth steps, are sequentially performed. While performing the first through the fourth steps, the wafers 200 are heated to a predetermined temperature by the heater 207. The gas pipe heater 22 heats the gas pipe 10 to a first temperature. The first temperature is appropriately set according to the source gas. In the present embodiment, Since $Si_2Cl_6$ is used as the source gas, the gas pipe heater 22 heats the gas pipe 10 to the first temperature of, for example, 180° C. or higher during the film-forming step S104. The exhaust pipe heater 20 heats the exhaust pipe 231 to at least 100° C. during the film-forming step S104.

<First Step>

In the first step, the $Si_2Cl_6$ gas is supplied into the process chamber 201 by opening the valve 34 provided at the gas pipe 10 and the APC valve 243 provided at the exhaust pipe 231. Specifically, the $Si_2Cl_6$ gas having the flow rate thereof adjusted by the flow rate controller 41 is supplied from the gas supply source 4 to the gas pipe 10. The $Si_2Cl_6$ gas having the flow rate thereof adjusted is then supplied to the process chamber 201 through the gas supply holes of the nozzle 234 and exhausted through the exhaust pipe 231. At this time, the gas pipe heater 22 heats the gas pipe 10 to the first temperature and the exhaust pipe heater 20 heats the exhaust pipe 231 to a predetermined temperature. The inner pressure of the process chamber 201 is adjusted to a predetermined pressure. By supplying the $Si_2Cl_6$ gas to the wafers 200, a silicon film is formed on the surfaces of the wafers 200.

<Second Step>

In the second step, the valve 34 provided at the gas pipe 10 is closed to stop the supply of the $Si_2Cl_6$ gas. The APC valve 243 provided at the exhaust pipe 231 is opened and the vacuum pump 246 exhaust the process chamber 201 to remove the remaining gas in the process chamber 201 from the process chamber 201. The remaining gas in the process chamber 201 may be further extruded by supplying an inert gas such as $N_2$ gas through the gas pipe 40 to the process chamber 201 by opening the valve 39 provided at the gas pipe 40. At this time, the gas pipe heater 22 heats the gas pipe 10 and the exhaust pipe heater 20 heats the exhaust pipe 231. An inert gas such as $N_2$ gas having the flow rate thereof adjusted by the flow rate controller 33 may be further supplied through the gas pipe 6 to the process chamber 201 by opening the valve 36 provided at the gas pipe 6.

<Third Step>

In the third step, the $NH_3$ gas is supplied into the process chamber 201 by opening the valve 35 provided at the gas pipe 11 and the APC valve 243 provided at the exhaust pipe 231. Specifically, the $NH_3$ gas having the flow rate thereof adjusted by the flow rate controller 32 is supplied from the gas supply source 5 to the gas pipe 11. The $NH_3$ gas having the flow rate thereof adjusted is then supplied to the process chamber 201 through the gas supply holes of the nozzle 233 and exhausted through the exhaust pipe 231. At this time, the exhaust pipe heater 20 heats the exhaust pipe 231. The pressure of the process chamber 201 is adjusted to a predetermined pressure. By a chemical reaction between the silicon film on the wafer 200 formed by the $Si_2Cl_6$ gas supplied in the first step and the NH₃ gas supplied in the third step, a silicon nitride (SiN) film is formed on the surfaces of the wafers 200.

<Fourth Step>

In the fourth step, the process chamber 201 is purged again by the inert gas. The valve 35 provided at the gas pipe 11 is closed to stop the supply of the NH₃ gas. The APC valve 243 provided at the exhaust pipe 231 is opened and the vacuum pump 246 exhaust the process chamber 201 to remove the remaining gas in the process chamber 201 from the process chamber 201. The remaining gas in the process chamber 201 may be further extruded by supplying an inert gas such as N₂ gas having the flow rate thereof adjusted by the flow rate controller 33 through the gas pipe 6 to the process chamber 201 by opening the valve 36 provided at the gas pipe 6. At this time, the exhaust pipe heater 20 heats the exhaust pipe 231. An inert gas such as N₂ gas may be further supplied through the gas pipe 40 to the process chamber 201 by opening the valve 39 provided at the gas pipe 40. At this time, the gas pipe heater 22 heats the exhaust pipe 231 and the gas pipe 40.

A silicon nitride (SiN) film having a desired thickness may be formed on the wafers 200 by performing a cycle including the first step through the fourth step a multiple times.

<Substrate Unloading Step S106>

Next, the boat 217 accommodating the wafers 200 having the SiN film thereon is unloaded from the process chamber 201.

According to the embodiment, the source (Si₂Cl₆) gas is supplied to the process chamber 201 through the gas pipe 10 heated by the gas pipe heater 22 and exhausted from the process chamber 201 through the exhaust pipe 231. Therefore, the temperature difference between the gas pipe 10 and the exhaust pipe 231 may be reduced such that the stability of the temperature of the gas in the process chamber 201 and the stabilities of gas supply and gas exhaust may be improved. As a result, the source gas having a desired flow rate may be supplied to the process chamber 201, and the uniformity of the film-formation may be improved.

According to the embodiment, since the exhaust pipe 231 is heated by the exhaust pipe heater 20 heats and the gas pipe 10 and the gas pipe 40 are heated by the gas pipe heater 22 while the cycle including the first step through the fourth step is repeated multiple times, the temperature difference is reduced and the temperatures of the exhaust pipe 231, the gas pipe 10 and the gas pipe 40 may be easily controlled. According to the embodiment, the exhaust pipe heater 20 may heat the exhaust pipe 231 to control the temperature thereof, and the exhaust pipe heater 20 may heat the gas pipe 10 and the gas pipe 40 to control the temperatures thereof during the execution of the process recipe, namely, from the substrate loading step S102 through the substrate unloading step S106.

<Pipe Heater>

Next, the pipe heater according to the present embodiment will be described along with the temperature detecting unit 550.

Figure 5A:
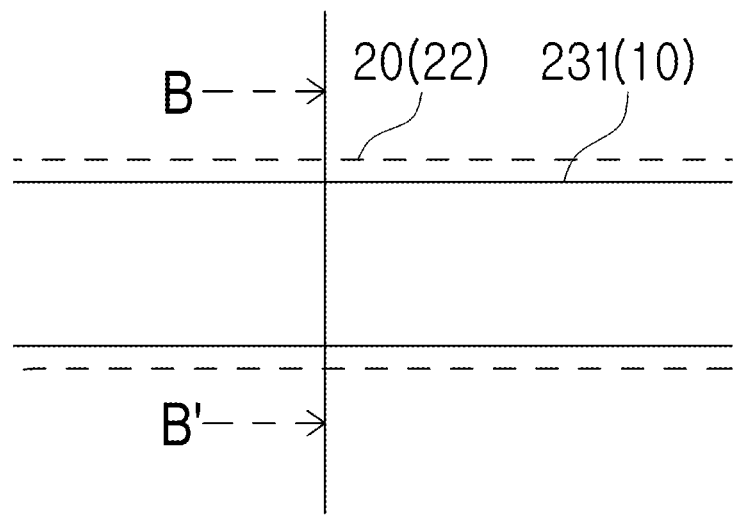
FIG. 5A illustrates circled portion A of FIG. 1.
Figure 5B:
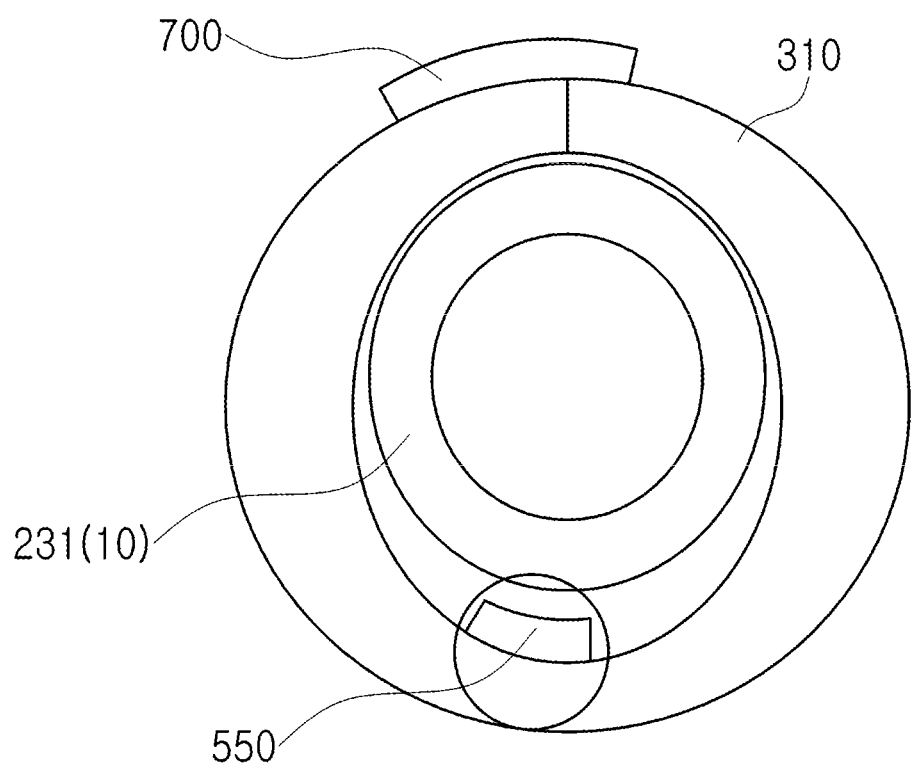
FIG. 5B is an exemplary cross-section taken along the line B-B' of FIG. 5A.

FIG. 5B is an exemplary cross-sectional view taken along the line B-B' of FIG. 5A illustrating the temperature detecting unit 550 provided between the pipe heater 310 and exhaust pipe 231. As shown in FIG. 5B, the pipe heater, which may be embodied by a jacket heater, is configured to cover the exhaust pipe 231 (or the gas pipe 10) made of a metal such as SUS with an enclosure. Specifically, the pipe heater 310 includes a heating element (not shown) configured to heat the exhaust pipe 231 (or the gas pipe 10), includes outside the enclosure surrounding the heating element disposed on the side opposite to the gas pipe where the heating element is located, and includes a fixing part 700 for fastening one end side and the other end side in a state where one end side and the other end side of the enclosure are adjacent to each other. The temperature detecting unit 550 (for example, a thermocouple) is provided between the pipe heater 310 and exhaust pipe 231 to detect the temperature of the exhaust pipe 231 (or the gas pipe 10).

The controller 321 controls the electrical power applied to the pipe heater 310 based on the temperature measured by the temperature detecting unit 550 to maintain the temperature of the exhaust pipe 231 and the gas pipe 10 at a desired temperature.

Figure 5C:
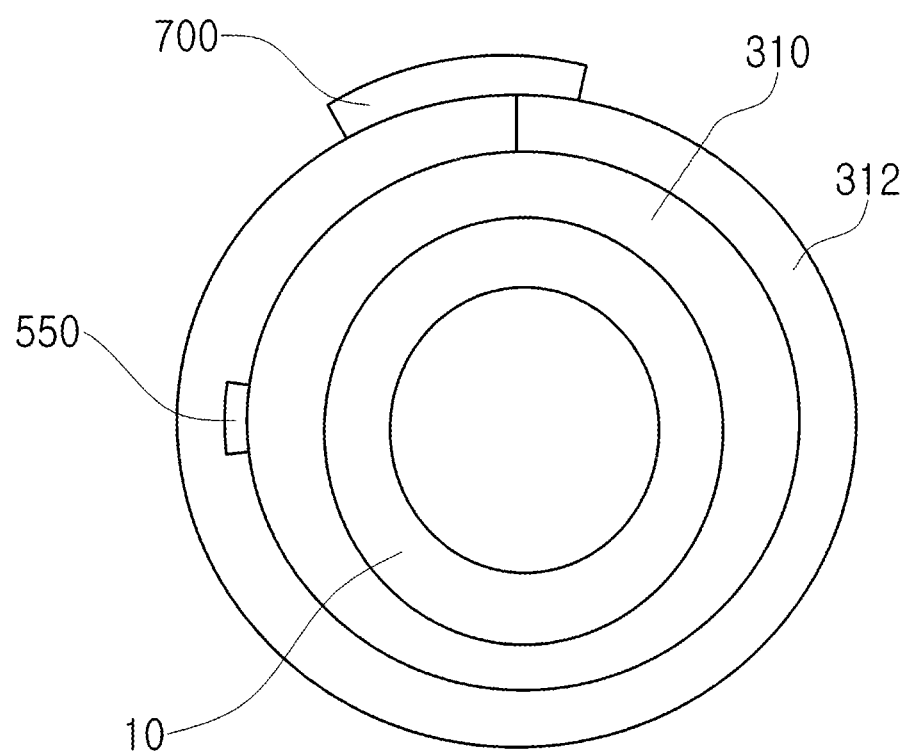
FIG. 5C is another exemplary cross-section taken along the line B-B' of FIG. 5A.

FIG. 5B is a cross-sectional view showing a state in which the temperature detecting unit 550 is provided inside the pipe heater 310, and FIG. 5C is a cross-sectional view showing a state in which the temperature detecting unit 550 is provided outside the pipe heater 310 in a state surrounded by the heat insulating material 6. Further, when the pipe heater 310 is attached to the outer periphery of the exhaust pipe 231 (gas pipe 10), one end side and the other end side of the enclosure are made to be adjacent to each other, and a gap between the one end side and the other end side is covered with the fixing part 700 is shown. As shown in FIG. 5B, the temperature detecting unit 550 may not measure the temperature accurately due to the gap between the pipe heater 310 and the exhaust pipe 231. That is, when the pipe heater 310 is attached to the outer periphery of the exhaust pipe 231 (the gas pipe 10), there is a case where the gap is generated between the piping heater 310 and the exhaust pipe 231 and the position of the temperature detecting unit 550 shifts.

In addition, the temperature-detecting unit 550 may be displaced during the maintenance of the pipe heater 310 shown in FIGS. 5B and 5C. Specifically, the position of the temperature detecting unit 550 may be shifted due to the attachment/detachment of the pipe heater 310 during the maintenance of the pipe heater 310. However, it is difficult to check whether the position of the temperature detecting unit 550 is shifted. For example, when the pipe heater 310 is reinstalled after a pipe exchange or pipe cleaning, the temperature measured by the temperature detecting unit 550 is regarded as the temperature of the pipe despite the shift in the position of the temperature-detecting unit 550 due to being unable to directly check the position of the temperature-detecting unit 550.

Since the pipe heater 310 is controlled such that the temperature of the gas pipe detected by the temperature detecting unit 550 is maintained at a preset temperature, the temperature of the gas pipe detected by the temperature detecting unit 550 may not be the actual temperature of the gas pipe when the temperature-detecting unit 550 is displaced. Therefore, when only the temperature (or the average of temperatures) of the gas pipe detected by the temperature detecting unit 550 is monitored, it may not be possible to accurately determine whether a temperature lowering error has actually occurred at the gas pipe. For example, even when the actual temperature of the gas pipe after the maintenance is lower than the actual temperature of the gas pipe before the maintenance, the temperatures measured by the temperature detecting unit 550 before and after the maintenance may be the same in case the temperature detecting unit 550 is reinstalled closer to the pipe then before maintenance.

Since the temperature of the gas pipe also varies when the electrical power applied to the pipe heater 310 is varied, it is necessary to monitor an abrupt change in the electrical power applied to the pipe heater 310. However, when only the electrical power (or the average of the electrical power) applied to the pipe heater 310 is monitored, it is not possible to determine whether the change in the electrical power is intentional or not. For example, when the film-forming condition (or process conditions) is changed and the flow rate of the gas flowing through the gas pipe increases, the electrical power is also changed. When the processing conditions that the preset temperature is changed considering the cooling of the gas pipe by the gas, is changed. The electrical power is also changed. When only the electrical power applied to the pipe heater 310 is monitored, it may be determined that a fault has occurred.

Figure 11A:
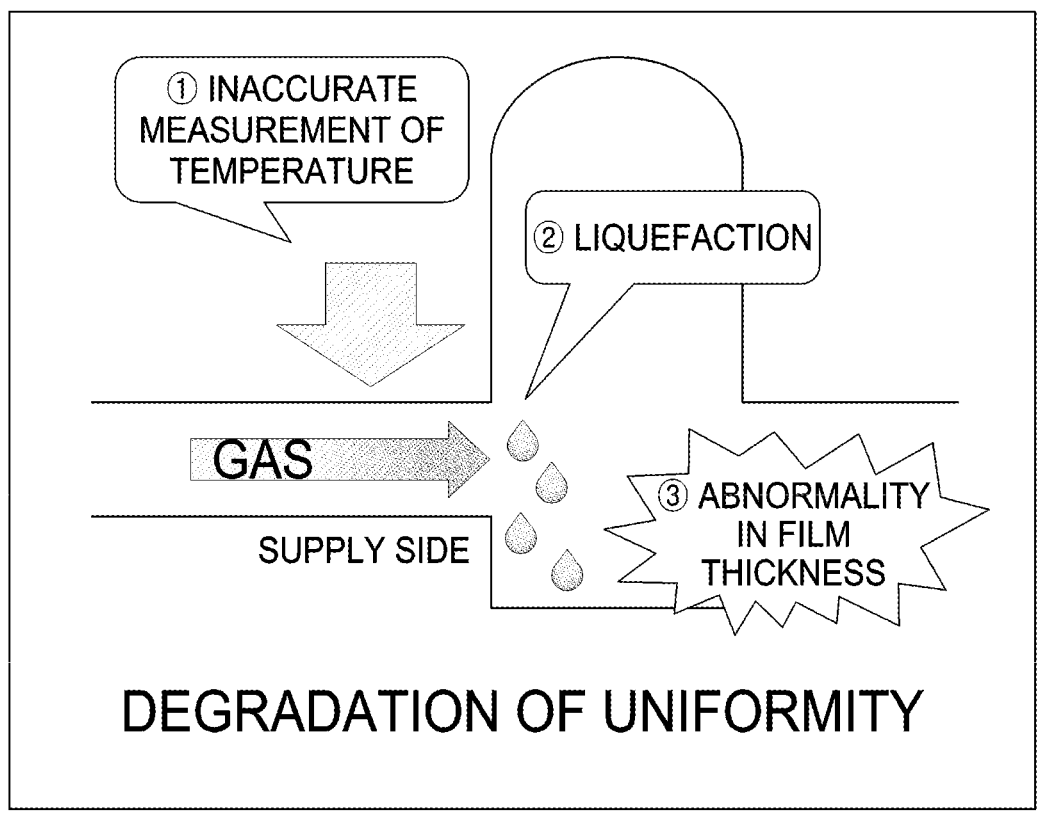
FIGS. 11A and 11B illustrate problems that may occur when the temperature of the pipe is not measured accurately.
Figure 11B:
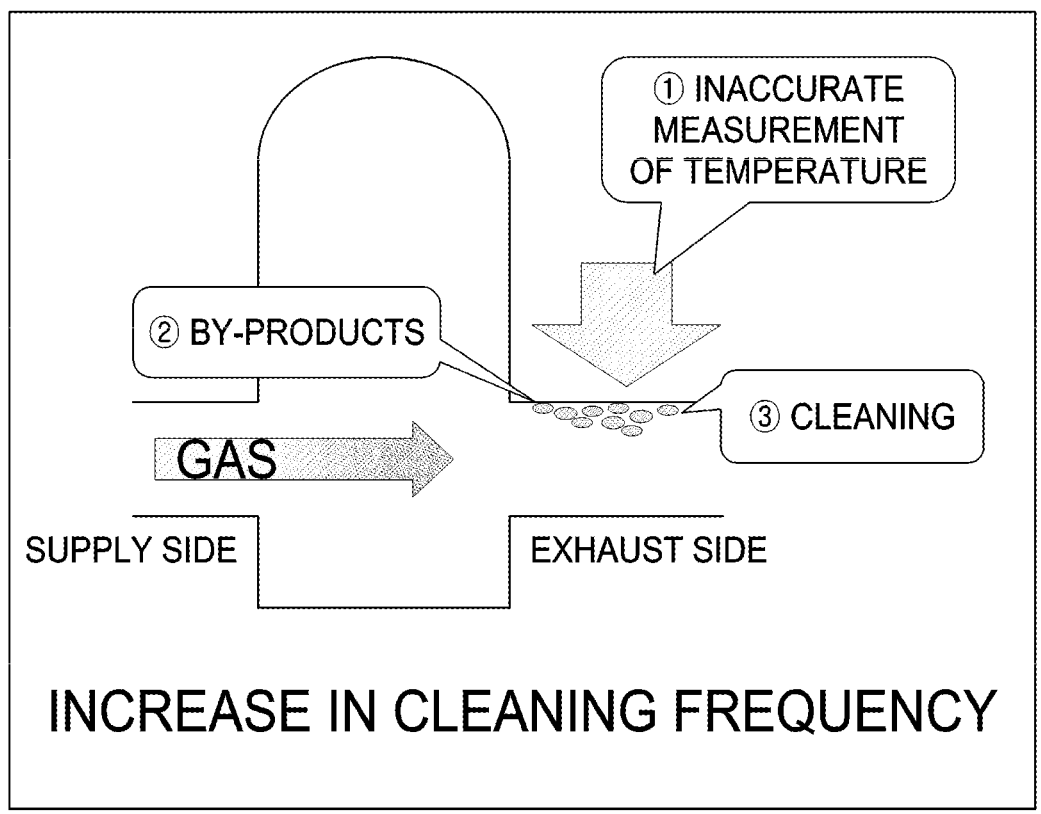

When the temperature detecting unit 550 is dislocated due to the detachment/reattachment of the pipe heater 310 during maintenance, the temperature of the pipe may not be accurately measured, resulting in the problems shown in FIGS. 11A and 11B. Specifically, When the temperature of the gas pipe 10 detected by the temperature detecting unit 550 is determined to be normal due to the dislocation of the temperature detecting unit 550 despite the actual temperature of the gas pipe 10 being lower than the preset temperature, the gas flowing through the gas pipe 10 may be liquefied and accumulated at a furnace opening 210 as shown in FIG. 11A. This causes a degradation of the uniformity of the film formed in the film-forming step. When the actual temperature of the exhaust pipe 231 is lower than the preset temperature but the temperature of the exhaust pipe 231 detected by the temperature detecting unit 550 is determined to be normal, by-products may be attached to the exhaust pipe 231 as shown in FIG. 11B. In this case, the exhaust pipe 231 should be cleaned, and when the number of times of the cleaning increases, the operation rate of the apparatus decreases.

In order to solve the problems shown in FIGS. 11A and 11B, the inventors of the present application created and used a monitored item table to detect faults (pipe temperature error) at the pipe without actually measuring the temperature of the pipe.

FIG. 6 shows the monitored item table to detect the temperature error of the exhaust pipe. The monitored item table includes a "FAULTS" item ("Temperature error at exhaust pipe") as an event (fault event) at the occurrence of an abnormality, a "DEVICE DATA" item ("Electrical power applied to the pipe heater" and "Measured temperature of the pipe") as device data to detect the fault, a "STATISTICAL DATA" item ("Average") as statistics of the device data corresponding to device data type and a "MONITORED STEP" item ("Film-forming step") as a execution step showing a period to be monitored. "MONITORED STEP" item is not limited to "Film-forming step" but may be other steps and be a plurality of step. The monitoring timing is started from the first step of the execution step.

The monitored item table further includes a "RULE" item ("Diagnostic rule 38") for diagnosing whether the temperature, electrical power and the averages thereof included in the device data and the statistical data are faulty. The device status monitoring unit 215e determines whether the fault has occurred according to the diagnostic rule 38. For example, when the diagnostic rule 38 defines that a fault has occurred in case that the difference between the average of temperatures of the pipe in the monitored step of current batch process and the average of temperatures of the pipe in the monitored step of the previous batch process is less than the first reference value and the difference between the average of electrical power applied to the pipe heater in the monitored step of current batch process and the average of electrical power applied to the pipe heater in the monitored step of the previous batch process is greater than the second reference value, the status monitoring unit 215e determines a fault accordingly.

The "DEVICE DATA" item in the monitored item table includes data (temperatures and the average thereof) indirectly related to the fault and data (electrical power and the average thereof) directly related to the fault. Specifically, the device data directly related to the fault is the electrical power applied to the pipe heater 310 that heats the exhaust pipe 231, and the statistical data directly related to the fault is the average of the electrical power applied to the pipe heater 310 that heats the exhaust pipe 231. The device data that is indirectly related to the fault is the temperature of the exhaust pipe 231, and the statistical data that is indirectly related to the fault is the average of the temperature of the exhaust pipe 231. That is, the data directly related to the fault refers to the factors that directly affect the temperature (or actual temperature) of the pipe, and data that is indirectly related to the fault refers to the factors data that does indirectly affect the temperature of the pipe.

Figure 8:
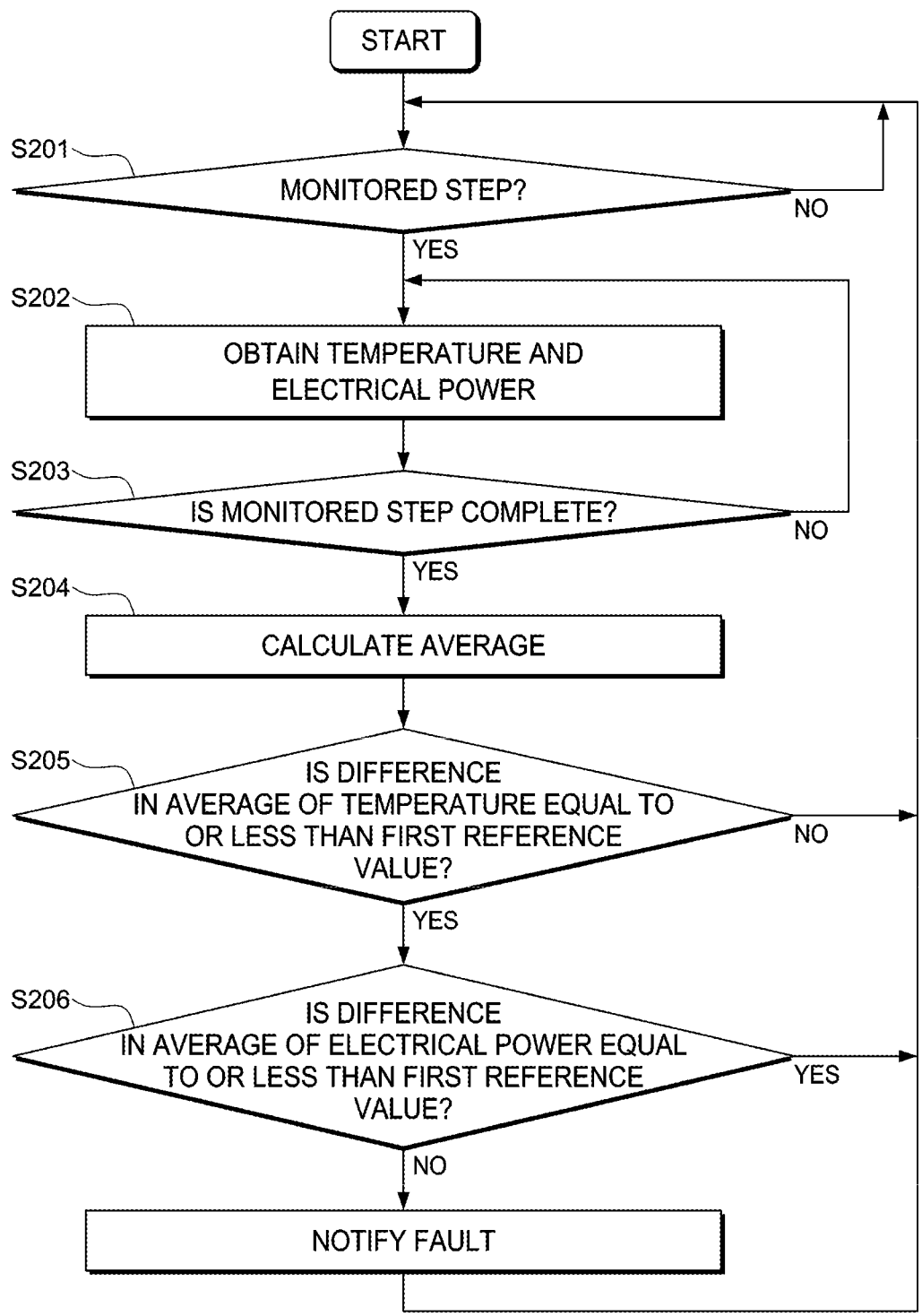
FIG. 8 is a flow chart illustrating a monitoring program executed by the device status monitoring unit of the substrate processing apparatus according to the embodiment.

FIG. 8 is a flow chart illustrating the pipe temperature error monitoring program according to the monitored item table of the device status monitoring unit 215e. Once the device management controller 215 is in operation, the monitoring program may be started automatically. According to the embodiment, for example, a temperature control program for applying a predetermined electrical power to the pipe heater 310 based on the temperature of the exhaust pipe 231 measured by the temperature detecting unit 550 provided in the pipe heater 310 heating the exhaust pipe 231 may be combined in a process recipe having a plurality of steps.

Accordingly, when the controller 321 executes the process recipe, the temperature control program may also be executed. While the embodiment is described on the basis of a temperature control program configured to control the temperature of the exhaust pipe 231, the technique may also be applied to a temperature control program configured to control the temperature of the gas pipe 10. The controller 321 is configured to transmit to the communication unit 215g various device data (e.g., the temperature of and the electrical power applied to the heater) generated by the parts constituting up the apparatus. The controller 321 may be configured to store the various device data in the memory unit 215. The controller 321 may execute the process recipe to subject the wafer 200 to predetermined processes (hereinafter, simply referred to as "batch process"). In the following description, the device status monitoring unit 215e executes the device status monitoring program. That is, the operation of the device status monitoring unit 215e described below is substantially the same as the steps in the device status monitoring program.

<Step S201>

The device status monitoring unit 215e monitors the device data transmitted from the controller 321 and checks whether there is an event data indicating the start of the monitored step in the monitored item table. When the device status monitoring unit 215e detects an event data indicating the start of the monitored step from the device data, the step S202 is performed. When the device status monitoring unit 215e fails to detect an event data related to the monitored step, the device status monitoring unit 215e is in a standby state until an event data is detected.

\<Step S202\>

When the device status monitoring unit 215e detects the event data indicating the start of the monitored step, the device status monitoring unit 215e extracts the temperature of the exhaust pipe 231 and the electrical power applied to the pipe heater 310 from the device data of the monitored device (defined in the monitored item table). The device status monitoring unit 215e may be configured to connect to at least one of the communication unit 215g and the memory unit 215h to obtain the device data.

\<Step S203\>

The device status monitoring unit 215e is configured to obtain the temperature of the exhaust pipe 231 and the electrical power applied to the pipe heater 310 from the device data until the event data indicating the completion of the monitored step is detected.

\<Step S204\>

The average of the temperature contained in the statistical data defined by the monitored item table, i.e. the average of the temperature of the exhaust pipe 231 is calculated from the temperatures obtained during the monitored step. Similarly, the average of the electrical power contained in the statistical data defined by the monitored item table, i.e. the average of the electrical power applied to the pipe heater 310 is calculated from the electrical power applied to the pipe heater 310 obtained during the monitored step.

\<Step S205\>

The average of the temperature of the exhaust pipe 231 calculated in the step S204 (current average) is compared with the average of the temperature of the exhaust pipe 231 in the monitored step of the previous batch process stored in the memory unit 215h to determine the difference in the statistical data. Specifically, the difference between the average of the temperature of the exhaust pipe 231 in the monitored step of the current batch process and the average of the temperature of the exhaust pipe 231 in the monitored step of the previous batch process is greater than the first reference value (e.g. 5° C.), the device status monitoring unit 215e stores the current average of the temperature of the exhaust pipe 231 (the average in the statistical data) and the average of electrical power applied to the pipe heater 310 in the memory unit 215h without determining the difference between the average of the electrical power applied to the pipe heater 310 in the monitored step of the current batch process and the average of the electrical power applied to the pipe heater 310 in the monitored step of the previous batch process. Thereafter, the step S201 is performed again.

Since the fault is determined according to the diagnostic rule of the monitored item table, the difference between the averages of the temperatures of the exhaust pipe 231 being greater than the reference value is not determined as a fault by the device status monitoring unit 215e. The integrity of the measured temperature of the pipe in the embodiment is managed by a known SPC (U.SPC), independent of the monitoring program (this process flow), and the temperature is determined to be faulty according to the diagnostic rule. If temperature is diagnosed to be faulty, icon "A" may be displayed as shown in FIG. 9.

When it is determined the device status monitoring unit 215e that the difference between the average of the temperature of the exhaust pipe 231 in the monitored step of the current batch process and the average of the temperature of the exhaust pipe 231 in the monitored step of the previous batch process is smaller than the reference value, the step S206 is performed.

\<Step S206\>

The average of the electrical power applied to the pipe heater 310 of the exhaust pipe 231 in the monitored step of the current batch process is compared by the device status monitoring unit 215e with the average of the electrical power applied to the pipe heater 310 of the exhaust pipe 231 in the monitored step of the previous batch process stored in the memory unit 215h to determine the difference.

Specifically, the difference between the average of the electrical power applied to the pipe heater 310 in the monitored step of the current batch process (current average) and the average of the electrical power applied to the pipe heater 310 in the monitored step of the previous batch process (previous average) stored in the memory unit 215h is greater than the second first reference value (e.g. 5%), the device status monitoring unit 215e stores the current average of the temperature of the exhaust pipe 231 (the average in the statistical data) and the average of electrical power applied to the pipe heater 310 in the memory unit 215h. Thereafter, the step S201 is performed again.

When the difference between the average of the electrical power applied to the pipe heater 310 in the monitored step of the current batch process and the average of the electrical power applied to the pipe heater 310 in the monitored step of the previous batch process is greater than the reference value, the status monitoring unit 215e determines that a temperature error has occurred in the exhaust pipe 231 and stores the current average of the temperature of the exhaust pipe 231 and the current average of the electrical power applied to the pipe heater 310 in the memory unit 215h, and the occurrence of the fault is notified in the form of an alarm.

For example, the device status monitoring unit 215e displays the device status monitoring result on the operation display unit 322 with the icon "A" shown in FIG. 9. The device status monitoring unit 215e may be configured to display a schematic diagram of the apparatus on the operation display unit 322 and to indicate the part at which the fault occurred (the unit corresponding to the area or the module shown in FIG. 9). The device status monitoring unit 215e may be further configured to notify the controller 321 that a temperature error has occurred in the exhaust pipe.

Since the electrical power applied to the pipe heater 310 directly affects the temperature of the pipe, it is necessary to monitor an abrupt change in the electrical power applied to the pipe heater 310. However, when the electrical power (or average of the electrical power) applied to the pipe heater 310 is intentionally changed to adjust the temperature, it is checked whether the currently measured temperature is the same as the previously measured temperature or whether the difference in the averages of the temperatures is equal to or less than the reference value. The reason for checking the measured temperature of the pipe heater 310 is that it is not sufficient to determine the relationship between the measured temperature and the electrical power with only the pre-set value of the electrical power to be applied to the pipe heater 310. For example, when the currently measured temperature (or the average of the currently measured temperature) is the same as the previously measured temperature (or the average of the previously measured temperature) is the same and only the electrical power (or the average of the electrical power) applied to the pipe heater fluctuates, it may be determined that the failure (or disconnection) of the thermocouple or the dislocation of the thermocouple is the cause of the fault.

According to the embodiment, an entirety of the pipe heaters may be monitored simply by using the above-described monitored item table. While the temperature of the exhaust pipe 231 is exemplified as an object to be monitored in the embodiment, the temperature of the gas pipe 10 may also be an object to be monitored. In that case, the monitored item table may further include an item for the temperature of the gas pipe 10. For example, by executing the monitoring program based on the monitored item table including the electrical power (or the average of the electrical power) applied to the pipe heater 310 that heats the gas pipe 10 and the temperature (or the average of the temperature) of the gas pipe 10, the temperature error of the gas pipe 10 may be detected automatically.

According to the embodiment, the fault of the temperature (or the difference in the averages of the temperatures) of the gas pipe 10 may be detected. For example, when the maintenance process such as reattachment of the pipe heater 310 is performed, the temperature of the pipe may not be accurately measured due to the dislocation of the thermocouple. When the temperature of the gas pipe 10 detected by the temperature detecting unit 550 is determined to be normal due to the dislocation of the temperature detecting unit 550 despite the actual temperature of the gas pipe 10 being lower than the preset temperature, the gas flowing through the gas pipe 10 may be liquefied and accumulated at the furnace opening 210. This problem may be prevented by detecting the fault in the temperature or the average of temperature of the gas pipe 10 according to the embodiment. As a result, degradation of the quality of substrate processing due to effect of the fault in the temperature on the thickness of the film in a film-forming process may be suppressed.

According to the embodiment, the fault of the temperature (or the difference in the averages of the temperatures) of the exhaust pipe 231 may be detected. For example, when the maintenance process such as reattachment of the exhaust pipe heater 20 is performed, the temperature of the pipe may not be accurately measured due to the dislocation of the thermocouple. When the temperature of the exhaust pipe 231 detected by the temperature detecting unit 550 is determined to be normal due to the dislocation of the temperature detecting unit 550 despite the actual temperature of the exhaust pipe 231 being lower than the preset temperature, by-products contained in the exhaust gas flowing through the exhaust pipe 231 may be attached to the exhaust pipe 231. This problem may be prevented by detecting the fault in the temperature or the average of temperature of the exhaust gas pipe 231 according to the embodiment such that the exhaust is not performed at a lower temperature. As a result, the cleaning cycle may be extended by suppressing the attachment of the exhaust gas to the exhaust gas pipe 231.

According to the embodiment, by comparing the temperature of the pipe (or the average of the temperature of the pipe) in the monitored step of current batch process with the temperature of the pipe (or the average of the temperature of the pipe) in the monitored step of the previous batch process, it may be determined whether the temperature of the pipe heater is intentionally changed. The electrical power (or the average of the electrical power) applied to the pipe heater may also be compared as well as the setting temperature (or the average of the setting temperature of the pipe).

For example, the "monitored step" in step S201 of the monitoring program shown in FIG. 8 is indicated by the "MONITORED STEP" item shown in FIG. 6, and the monitored step is "film-forming step" as shown in FIG. 6. In this case, the monitoring program is executed when a batch process for executing a process recipe to subject the wafer 200 to a predetermined process is performed. However, the monitored step may be determined not only by the "MONI-TORED STEP" item but also by a time period or the like. When the film-forming step of the process recipe is completed, the monitoring program stores the calculated statistical data in the memory unit 215*h*, and waits until a subsequent process recipe is executed and the film-forming step is performed according to the monitored item table.

According to the present embodiment, the device status monitoring unit 215*e* is configured to notify the controller 321 of a temperature error when the temperature error occurs at the exhaust pipe. The controller 321 is configured to stores the temperature error of the exhaust pipe when notified. After the temperature error of the exhaust pipe is stored, the controller 321 controls the substrate processing apparatus 100 such that the process recipe to be executed next does not start when the process recipe that is currently being executed is finished to suppress the adverse effect on the wafer 200 due to inaccurate temperature of the exhaust pipe 231 or of the gas pipe 10. Therefore, the degradation of the quality of the substrate processing and loss in substrate may be suppressed.

Also according to the embodiment, as shown in FIG. 9, the execution result of the monitoring program may be indicated by the icon "A." When the icon "A" (or the cell marked with the icon "A") shown in FIG. 9 is selected from the screen, the fault analysis unit 215*f* executes the data analysis program.

The fault analysis unit 215*f* searches the memory unit 215*h* based on the type of device data defined by the monitored item table (the temperature of the pipe or the electrical power applied to the heater), and acquires the statistical data of device data corresponding to the type of device data. The fault analysis unit 215*f* may be configured to search the memory unit 215*h* based on the type of device data indicated in the DEVICE DATA item, and acquires the statistical data of the device data corresponding to a predetermined number of times of batch process, which the device data of the step indicated in the MONITORED STEP item and display the statistical data of the device data of the previous step the operation display unit 322 in order from the time when the current batch process is executed to the past, by performing a data analysis program.

As described above, the fault analysis unit 215*f* is configured to display, on the operation display unit 322, information necessary for analysis (e.g., the average of the temperature in the device data corresponding to the type of device data defined in the monitored item table). Alternatively, the maintenance personnel enters a minimum condition to be used at the time of the fault occurrence into the operation display unit 322, and the fault analysis unit 215*f* may be configured to execute the data analysis program and display the information necessary for analysis on the operation display unit 322.

The horizontal axes in FIGS. 10A and 10B are time axes representing the time at which the batch process was performed. The vertical axis of the graph in FIG. 10A represents the average of the temperature of the pipe in the monitored step, and the vertical axis of the graph in FIG. 10B represents the average of the electrical power applied to the pipe heater 310 in the monitored step. Here, the monitored step may be a film-forming step for forming a film on the wafer 200.

FIGS. 10A and 10B illustrate the average of the temperature of the pipe and the average of the electrical power applied to the pipe heater 310 in each batch process. Each of the average of the temperature and electrical power are displayed a predetermined number of times past from the current batch process. As shown in FIGS. 10A and 10B, the average of the temperature is constant at 100° C. in all of the batch processes while the average of the electrical power applied to the heater increase from 50% to 70% at the point of fault occurrence (indicated by the dotted line).

As shown, the electrical power (or average of the electrical power) applied to the pipe heater 310 fluctuates even when the average of the temperature of the pipe is constant or the average difference of the temperature of the pipe is less than the reference value. In this case, it may be determined that a fault such as a failure of the temperature detecting unit 550 or an dislocation of the temperature detecting unit 550 has occurred. The fault analysis unit 215f displays the information obtained by combining non-faulty item with the faulty item on the operation display unit 322. Therefore, the operator may confirm the fault occurrence and the fault accurately.

As shown in FIG. 10A and FIG. 10B, the average of the temperature of the pipe detected at predetermined time interval and the average of the electrical power applied to the pipe heater detected at predetermined time interval are displayed separately as graphs on the operation display unit 322. However, the average of the temperature of the pipe detected at predetermined time interval and the average of the electrical power applied to the pipe heater detected at predetermined time interval may be displayed on the operation display unit 322 as a single graph. As described above, the fault may be detected by checking the average of the temperature of the pipe detected at predetermined time interval of each batch process and the average of the electrical power applied to the pipe heater detected at predetermined time interval. Furthermore, the operator can visually confirm the validity of the detection result, and it is possible to reduce a false alarm of the fault detection.

As shown in FIG. 10A and FIG. 10B, although the actually measured temperature of the pipe and the electrical power of the pipe heater are displayed on the operation display section 322 in a state where the batch process in which the horizontal axis is shown in separate graphs is displayed, it is possible to display the operation display unit 322. In this way, by checking the change in the electrical power of the pipe heater between the batches, it is possible to estimate the temperature change in the pipe.

In addition, the event data such as the alarm generation history is generated when the temperature error of the pipe occurs. Therefore, the fault analysis unit 215f may be configured to retrieve the production history information from the memory unit 215h and to display the event data on the operation display unit 322. In this case, since data that may not be represented by numerical values such as maintenance information is displayed along with the graph, the data other than the device data (for example, replacement or reattachment of the pipe heater) may be easily checked.

According to the embodiment, maintenance personnel may efficiently analyze time-consuming trouble with a large the amount of data efficiently. That is, since the maintenance personnel may perform fault analysis efficiently, the downtime of trouble-generating devices may be reduced.

While the present embodiment exemplifies a semiconductor manufacturing apparatus for manufacturing a semiconductor as the substrate processing apparatus 100, the above-described technique is not limited thereto. The above-described technique may also be applied to an apparatus such as an LCD (Liquid Crystal Display) manufacturing apparatus configured to process a glass substrate. The above-described technique may also be applied to various substrate processing apparatuses such as an exposure apparatus, a lithography apparatus, a coating apparatus and a processing apparatus using plasma.

According to the technique described herein, the fault of an apparatus may be detected from error in the device data.

What is claimed is:
1. A substrate processing apparatus comprising:
a pipe heater configured to heat a gas pipe;
a temperature detecting unit provided at the pipe heater and configured to detect a temperature of the gas pipe;
a control unit having a processor and a memory and operable to execute a process control program for monitoring and controlling parameters of a substrate processing, wherein the control unit is configured to control the pipe heater based on device data representing the temperature of the gas pipe measured by the temperature detecting unit by executing the process control program to adjust an electrical power applied to the pipe heater;
a memory unit configured to store a monitored item table defining: a FAULT item indicative of a fault; a DEVICE DATA item indicative of a type of device data for detecting the fault; a STATISTICAL DATA item indicative of statistical data obtained from the device data indicated by the DEVICE DATA item; a MONITORED STEP item indicative of a period being monitored to obtain the statistical data indicated by the STATISTICAL DATA item; and a RULE item indicative of diagnostic rule for diagnosing the fault indicated in the FAULT item; and
a device status monitoring unit configured to execute a device status monitoring program, the device status monitoring program configured to perform: (a) collecting the device data representing the temperature and device data representing the electrical power transmitted from the control unit; (b) calculating current statistical data from the device data representing the temperature and the device data representing the electrical power; (c) comparing the current statistical data from the device data representing the temperature obtained from a step indicated in the MONITORED STEP item with a previous statistical data of device data representing temperature obtained from the step indicated in the MONITORED STEP item stored previously in the memory unit; (d) comparing the current statistical data from the device data representing the electrical power obtained from the step indicated in the MONITORED STEP item with a previous statistical data of device data representing electrical power obtained from the step indicated in the MONITORED STEP item stored previously in the memory unit to determine whether a difference between the current statistical data from the device data representing the electrical power and the previous statistical data of device data representing electrical power is equal to or smaller than a second reference value when a difference between the current statistical data from the device data representing the temperature and the previous statistical data of device data representing temperature is equal to or smaller than a first reference value; and (e) storing in the memory unit the current statistical data from the device data representing the temperature and the current statistical data from the device data representing the electrical power without determining the difference between the current statistical data from the device data representing the electrical power and the previous statistical data of device data representing electrical power when the difference between the current statistical data from the device data representing the temperature and the previous statistical data of device data representing temperature is greater than the first reference value.

2. The substrate processing apparatus of claim 1, wherein the control unit is further configured to store a plurality of device data received from component of the substrate processing apparatus during an execution of the process control program having a plurality of steps, and the device status monitoring program is further configured to perform: obtaining one of the plurality of device data indicated in the DEVICE DATA item when one of the plurality of steps indicated in the MONITORED STEP item of the monitored item table starts.

3. The substrate processing apparatus of claim 2, wherein the device status monitoring program is further configured to perform: calculating the statistical data indicated in the STATISTICAL DATA item of the monitored item table from the one of the plurality of device data when one of the plurality of steps indicated in the MONITORED STEP item of the monitored item table is completed.

4. The substrate processing apparatus of claim 3, wherein the device status monitoring program is further configured to perform: comparing the current statistical data from the device data representing the temperature indicated in the STATISTICAL DATA item of the monitored item table with the previous statistical data of device data representing temperature indicated in the STATISTICAL DATA item of the monitored item table stored in the memory unit to determine the difference between the current statistical data from the device data representing the temperature and the previous statistical data of device data representing temperature.

5. The substrate processing apparatus of claim 1, further comprising a display unit configured to display a monitoring result obtained from the device status monitoring unit, wherein the device status monitoring program is further configured to control the display unit to display the monitoring result when the difference between the current statistical data from the device data representing the electrical power and the previous statistical data of device data representing electrical power is greater than the second reference value.

6. The substrate processing apparatus of claim 1, wherein the "DEVICE DATA" item indicates device data directly related to the fault and device data indirectly related to the fault.

7. The substrate processing apparatus of claim 6, wherein the device status monitoring program is further configured to determine whether a difference between a current statistical data of the device data directly related to the fault obtained from the step indicated in the MONITORED STEP item and a previous statistical data of the device data directly related to the fault obtained from the step indicated in the MONITORED STEP item is equal to or smaller than the second reference value when a difference between a current statistical data of the device data indirectly related to the fault obtained from the step indicated in the MONITORED STEP item and a previous statistical data of the device data indirectly related to the fault obtained from the step indicated in the MONITORED STEP item is equal to or smaller than the first reference value.

8. The substrate processing apparatus of claim 7, further comprising a display unit configured to display a monitoring result obtained from the device status monitoring unit, wherein the device status monitoring program is further configured to control the display unit to display the monitoring result as an icon when the difference between the current statistical data of the device data directly related to the fault and the previous statistical data of the device data directly related to the fault is greater than the second reference value.

9. The substrate processing apparatus of claim 7, wherein the device status monitoring program is further configured to store the current statistical data of the device data indirectly related to the fault and the current statistical data of the device data directly related to the fault when the difference between the current statistical data of the device data indirectly related to the fault and the previous statistical data of the device data indirectly related to the fault is greater than the first reference value.

10. The substrate processing apparatus of claim 8, further comprising: a fault analysis unit configured to obtain a current device data of step and a previous device data of step from the memory unit based on the type of device data indicated by the DEVICE DATA item in the monitored item table when the fault occurs, wherein the fault analysis unit is configured to search the memory unit based on the type of device data indicated in the DEVICE DATA item, obtain the device data corresponding to a predetermined number of times of batch process, which the device data of the step indicated in the MONITORED STEP item and display the device data on the display unit in order from the time when the current batch process is executed to the past, by performing a data analysis program, if the icon is pressed.

11. The substrate processing apparatus of claim 10, wherein fault analysis unit is further configured to retrieve production history information from the memory unit and display event data on the display unit.

* * * * *